United States Patent
Liu

(10) Patent No.: US 7,150,311 B2
(45) Date of Patent: Dec. 19, 2006

(54) RADIATION MODULE CAPABLE OF RESISTING REVERSE FLOW OF HOT FLUID

(75) Inventor: Wen-Hao Liu, Taipei (TW)

(73) Assignee: Asia Vital Component Co., Ltd., Kaohsiung (TW)

( * ) Notice: Subject to any disclaimer, the term of this patent is extended or adjusted under 35 U.S.C. 154(b) by 16 days.

(21) Appl. No.: 11/001,112

(22) Filed: Dec. 2, 2004

(65) Prior Publication Data
US 2006/0118275 A1    Jun. 8, 2006

(51) Int. Cl.
*H05K 7/20* (2006.01)
(52) U.S. Cl. .............. 165/80.3; 165/121; 361/697
(58) Field of Classification Search ............. 165/80.3, 165/121, 135; 361/697
See application file for complete search history.

(56) References Cited

U.S. PATENT DOCUMENTS

| | | | | |
|---|---|---|---|---|
| 5,592,363 A | * | 1/1997 | Atarashi et al. ............ | 361/689 |
| 5,630,469 A | * | 5/1997 | Butterbaugh et al. ...... | 165/80.3 |
| 5,864,464 A | * | 1/1999 | Lin ........................... | 361/697 |
| 5,873,406 A | * | 2/1999 | Horng ........................ | 165/80.3 |
| 5,943,210 A | * | 8/1999 | Lee et al. ................... | 361/697 |
| 6,104,609 A | * | 8/2000 | Chen .......................... | 361/695 |
| 6,179,046 B1 | * | 1/2001 | Hwang et al. ............. | 165/80.3 |
| 6,382,306 B1 | * | 5/2002 | Hsu ........................... | 165/80.3 |
| 6,407,919 B1 | * | 6/2002 | Chou .......................... | 361/697 |
| 6,923,619 B1 | * | 8/2005 | Fedoseyev et al. ......... | 415/176 |
| 6,969,234 B1 | * | 11/2005 | Lin ........................... | 415/214.1 |
| 2002/0100577 A1 | * | 8/2002 | Wagner ..................... | 165/80.3 |
| 2003/0137807 A1 | * | 7/2003 | Chen .......................... | 361/697 |
| 2003/0169569 A1 | * | 9/2003 | Li et al. ..................... | 361/697 |
| 2005/0189088 A1 | * | 9/2005 | Wang et al. ............... | 165/80.3 |

\* cited by examiner

*Primary Examiner*—Allen J. Flanigan

(57) ABSTRACT

A radiation module capable of resisting reverse flow of hot fluid includes a fan, a radiator and a retaining tool. The fan provides an inlet and an outlet. The radiator is connected to the outlet of the fan. The retaining tool secures the radiator to a heat generation part. At least a baffle is provided in the radiation module. The fluid enters the fan via the inlet and flows toward the radiator via the outlet to cool the heat-generating component and the hot fluid moving outward the radiator is resisted entering the inlet with the baffle part so as to enhance heat dissipation efficiency.

5 Claims, 12 Drawing Sheets

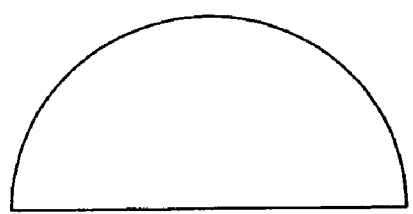
FIG 16
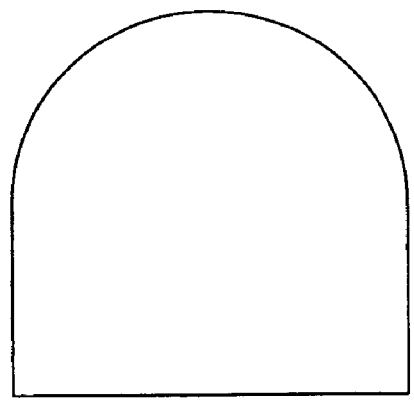
FIG 17
FIG 18
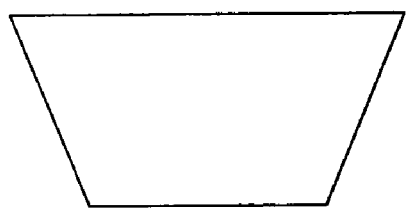
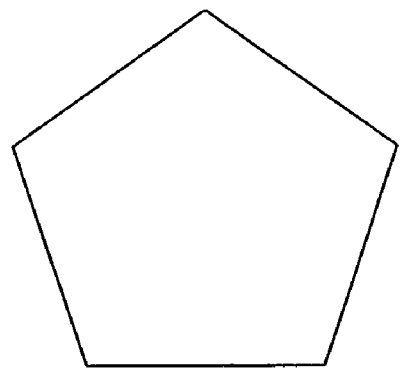
FIG 19
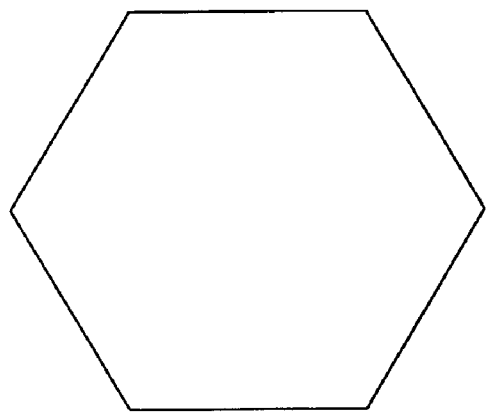
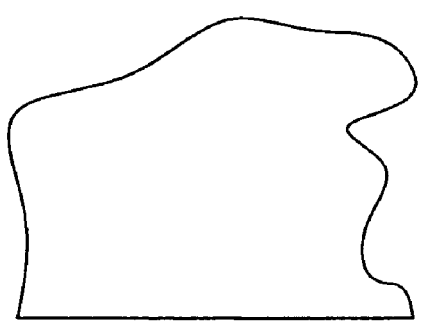
FIG 20 FIG 21

RADIATION MODULE CAPABLE OF RESISTING REVERSE FLOW OF HOT FLUID

BACKGROUND OF THE INVENTION

1. Field of the Invention

The present invention is related to a radiation module capable of resisting reverse flow of hot fluid.

2. Brief Description of the Related Art

Referring to FIGS. 1 to 3, the conventional radiation module includes a fan 14, a radiator 15 and a retaining tool 16. The heat-generating component 12 is disposed in a base seat 13 of a main board 11 and the base seat 13 is provided with a lock piece 131, which extend outward from two opposite sides of the base seat 13 respectively. The radiator 15 is attached to the surface of the heat-generating component 12 with a plurality of cooling fins 151 in the radiator 15 being arranged in a way of being parallel to each other to form a plurality of flow passages 152 between the cooling fins 151 for being available for the fluid passing through. The retaining tool 16 fits with the radiator 15 and has a cover frame 161 with a stationary holding part 162 and a movable holding part 163 being oppositely disposed at two opposite lateral sides corresponding to the lock piece 131 at two opposite sides of the base seat 13 and a plurality of four through holes 164 being disposed at four corners of retaining tool 16. The holding parts 162, 163 have an engaging hole 1621, 1631 to engage with the lock piece 131 such that the cover frame 161 can press the radiator 15 to closely contact with the surface of heat-generating component 12. The fan 14 provides a frame 141 and a fan wheel 142. The frame 141 has through holes 1411 corresponding to the through holes 164 at the cover frame 161 and provides an inlet 1412 and an outlet 1413 at two opposite sides thereof respectively with the outlet 1413 facing the radiator 15. Four fasteners 17 pass through the through holes 1411 of the frame 141 and the through holes 164 of the cover frame 161 such that the fan 14 can be secured to the radiator 15 and the retaining tool 16.

The fan 14 rotates to force the fluid to enter the fan 14 via the inlet 1412 and move toward the radiator 15 via the outlet 1413 and then flows outward via the flow passages 152 of the radiator 15. The fluid becomes hot after passing through the radiator 15 due to heat transfer to heat in the radiator 15. However, it is easy for the hot fluid around the radiator 15 to flow back to the fan 14 via the inlet 1412 while the fan 14 running. As a result, lower heat convection efficiency is obtained with lower heat dissipation efficiency.

SUMMARY OF THE INVENTION

An object of the present invention is to provide a radiation module capable of resisting [backward] reverse flow of hot fluid in which at least a baffle part is arranged to resist the hot fluid entering the fan via the inlet thereof again for enhancing the heat dissipation efficiency.

Another object of the present invention is to provide a radiation module capable of resisting reverse flow of hot fluid with which the life span of the heat-generating component can be extended.

A further object of the present invention is to provide a radiation module capable of resisting reverse flow of hot fluid in which the baffle [thereof] is made of sound absorptive material to attenuate noise decibel.

Accordingly, the radiation module capable of resisting reverse flow of hot fluid according to the present invention comprises a fan, a radiator and a retaining tool. The fan provides an inlet and an outlet. The radiator is disposed next to the outlet of the fan. The retaining tool secures the radiator to a heat-generating component. At least a baffle part is provided in the radiation module. The fluid enters the fan via the inlet and flows toward the radiator at the outlet to assist cooling the heat-generating component and the fluid, which becomes hot after passing through the radiator, can be resisted moving backward by means of the arrangement of the baffle part so as to enhance heat dissipation efficiency.

BRIEF DESCRIPTION OF THE DRAWINGS

The detail structure, the applied principle, the function and the effectiveness of the present invention can be more fully understood with reference to the following description and accompanying drawings, in which:

FIG. 16 is a plan view illustrating another type of the baffle in the preceding embodiments;

FIG. 17 is a plan view illustrating a further type of the baffle in the preceding embodiments;

FIG. 18 is a plan view illustrating a further type of the baffle in the preceding embodiments;

FIG. 19 is a plan view illustrating a further type of the baffle in the preceding embodiments;

FIG. 20 is a plan view illustrating a further type of the baffle in the preceding embodiments; and FIG. 21 is a plan view illustrating a further type of the baffle in the preceding embodiments.

DETAILED DESCRIPTION OF THE PREFERRED EMBODIMENT

Figure 1:
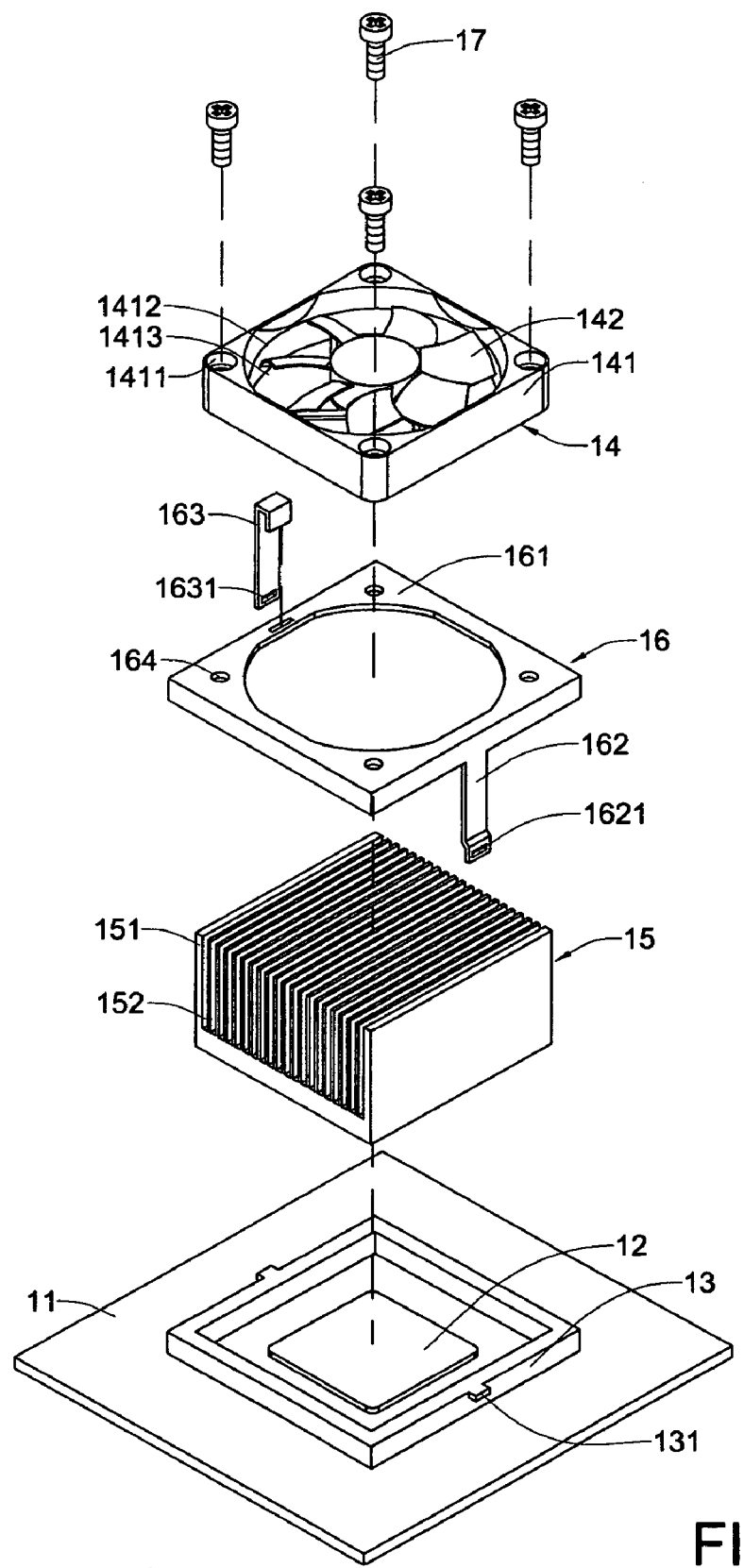
FIG. 1 is an exploded perspective view of the conventional radiation module.
Figure 2:
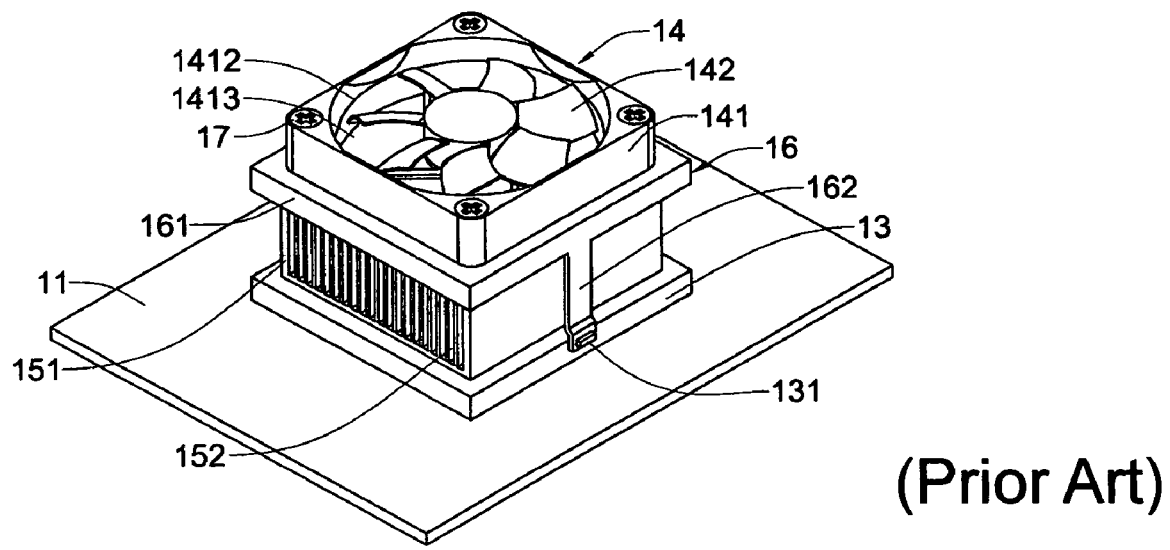
FIG. 2 is an assembled perspective view of the conventional radiation module.
Figure 3:
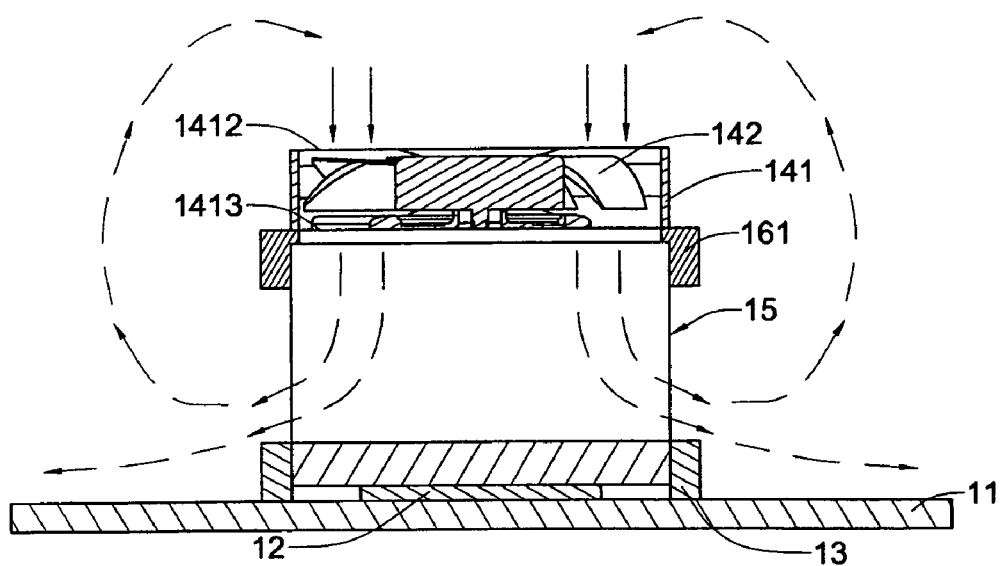
FIG. 3 is a sectional view of the conventional radiation module illustrating operation thereof.
Figure 4:
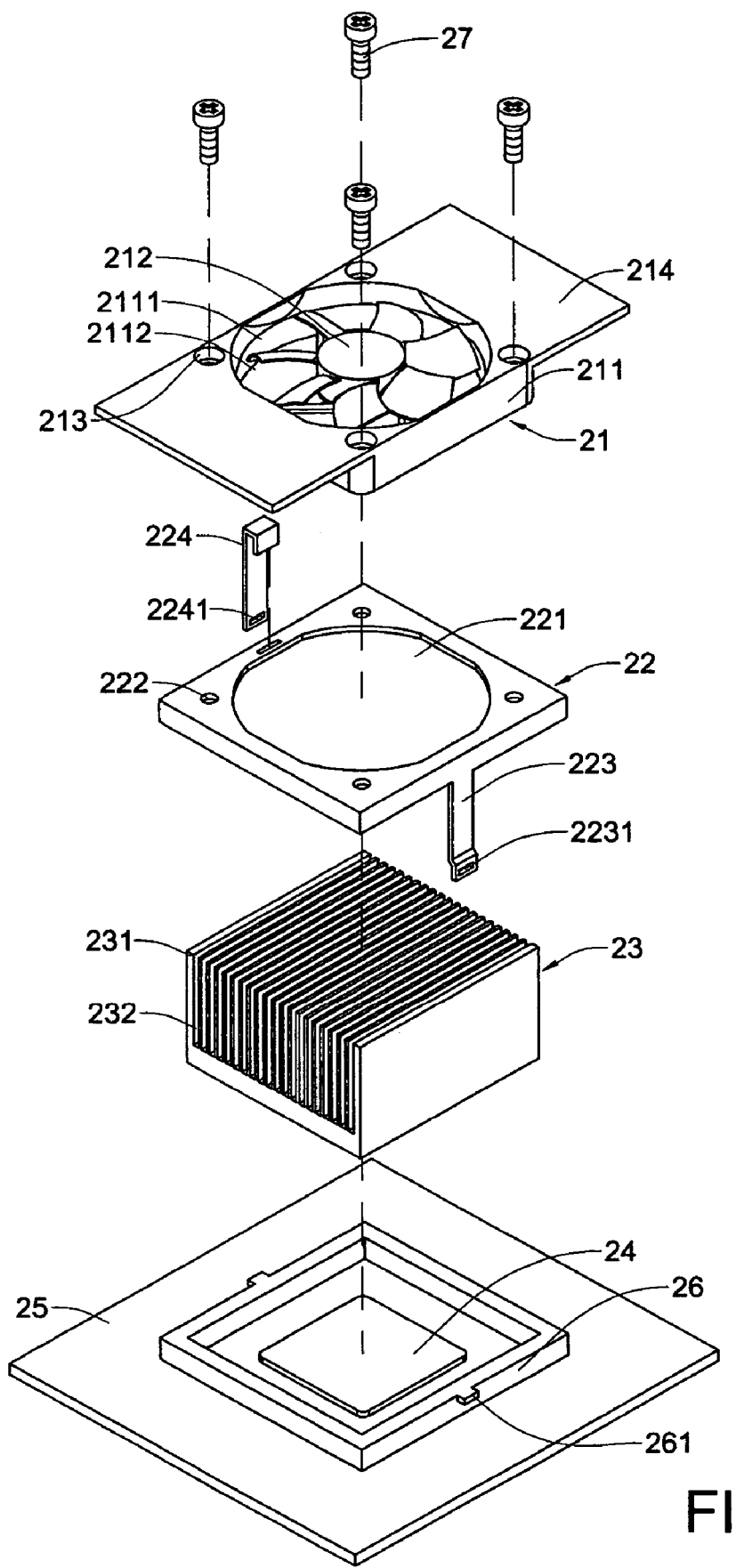
FIG. 4 is an exploded perspective view of the first embodiment of a radiation module capable of resisting reverse flow of hot fluid according to the present invention.
Figure 5:
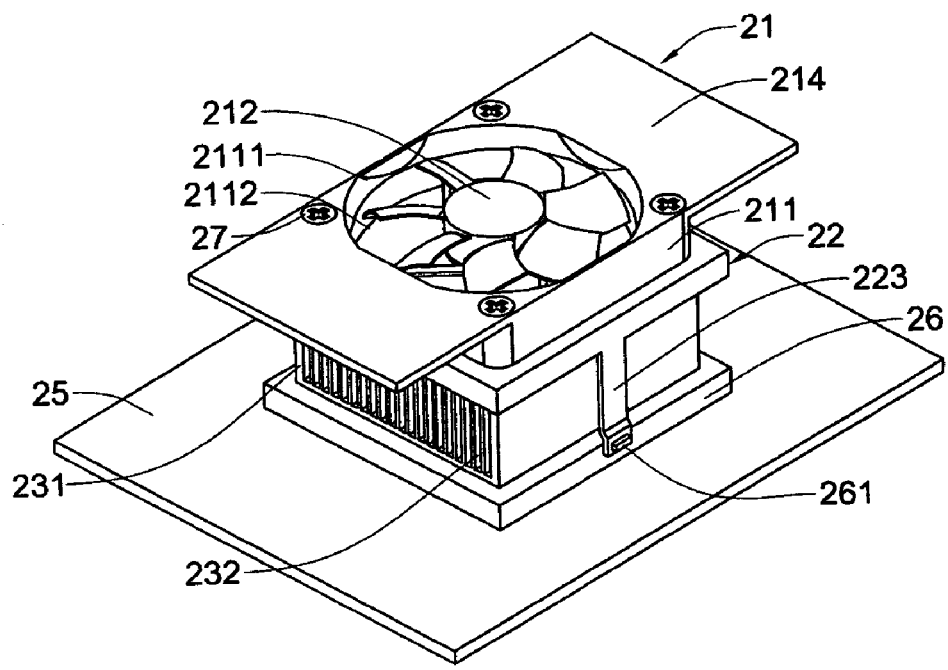
FIG. 5 is an assembled perspective view of the first embodiment according to the present invention.

Referring to FIGS. 4 and 5, the first embodiment of a radiation module capable of resisting reverse flow of hot fluid according to the present invention includes a radiation module and a heat-generating component 24. The radiation module comprises a fan 21, a radiator 23 and a retaining tool 22. The fan 21 further comprises a fan frame 211 and a fan wheel 212. The fan frame 211 provides an inlet 2111 and an outlet 2112. The fan frame 211 has through holes 213 at four corners thereof for being passed through with fasteners 27 and has a baffle part 214 extending outward from periphery of the inlet 2111 of the fan frame 211. The radiator 23 has a plurality of cooling fins 231 being arranged in parallel to each other and upright from the bottom of the radiator 23 with a flow passage 232 between adjacent cooling fins 231 for fluid flowing through. The retaining tool 22 has a central opening 221 with four corners thereof having through holes 222 corresponding to the though holes 213 of the fan 21 for the fan 21 being secured to the retaining tool 22 and the radiator 23. A lateral side of the retaining tool 22 extends downward a holding part 223 and another lateral side of the retaining tool 22 has a slot opposite to the holding part 23 for locating a detachable holding part 224. The lower ends of the holding parts 223, 224 have an engaging hole 2231, 2241 respectively and the holding part 224 is movably attached to the retaining tool 22. The heat-generating component 24 is disposed in a base seat 26 of a main board 25 and the base seat 26 is a frame for receiving the radiator 23 with a locking piece 261 jutting out two opposite sides of the base seat 26 for engaging with the engaging holes 224.

The heat-generating component 24 is placed in the base seat 26 of the main board 25 and the radiator 23 of the radiation module is closely attached to the surface of the heat-generating component 24. Then, the holding parts 223, 224 at two lateral sides of retaining tool 22 are arranged to be perpendicular to both lateral sides of the base seat 26 and the engaging holes 2231, 2241 of the holding parts 223, 224 engage with the lock pieces 261 of the base seat 26 such that the retaining tool 22 can secure the radiator 23 to the heat-generating component 24 to allow the outlet 2112 of the fan 21 is on the retaining tool 22. Then, the fasteners 27 pass through the through holes 213 of the fan frame 211 and through holes 222 of the retaining tool 22 to allow the fan 21 being joined to the radiator 23 and the retaining tool 22. Further, the baffle part 214 extends along two opposite directions to exceed both lateral ends of the respective flow passage 232.

Figure 6:
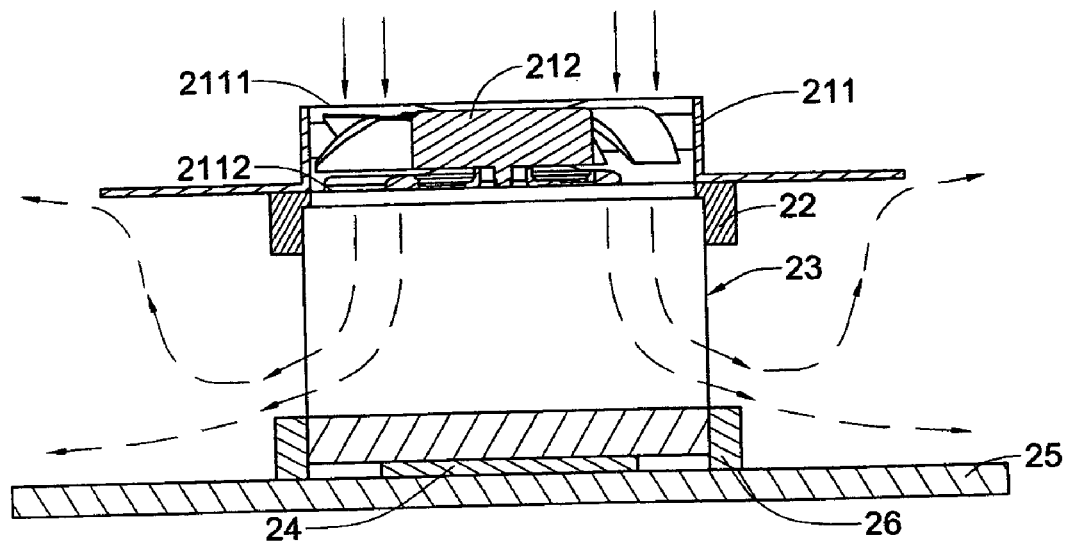
FIG. 6 is a sectional view of the first embodiment according to the present invention illustrating operation thereof.

Referring to FIG. 6, when the fan 21 rotates, the fluid is forced to enter the fan 21 via the inlet 2111 and flows toward the radiator 23 via the outlet 2112. When the fluid passes through the radiator 23, which transmits heat of the heat-generating component 24, heat transfer between the fluid and the cooling fins 231 is performed to increase temperature of the fluid. Afterwards, the hot fluid flows out via two lateral ends of the respective flow passage 232. Besides, baffle part 214 resists the hot fluid flowing back to the inlet 2111 of the fan 21 to avoid lower convection efficiency. Hence, the disadvantage of the conventional radiation module is overcome such that heat dissipation efficiency of the radiation module can be enhanced and life span of the heat-generating component 24 can be prolonged.

The baffle part 214 can be made integrally with the fan 21 or can be a separate unit from the fan 21.

Figure 7:
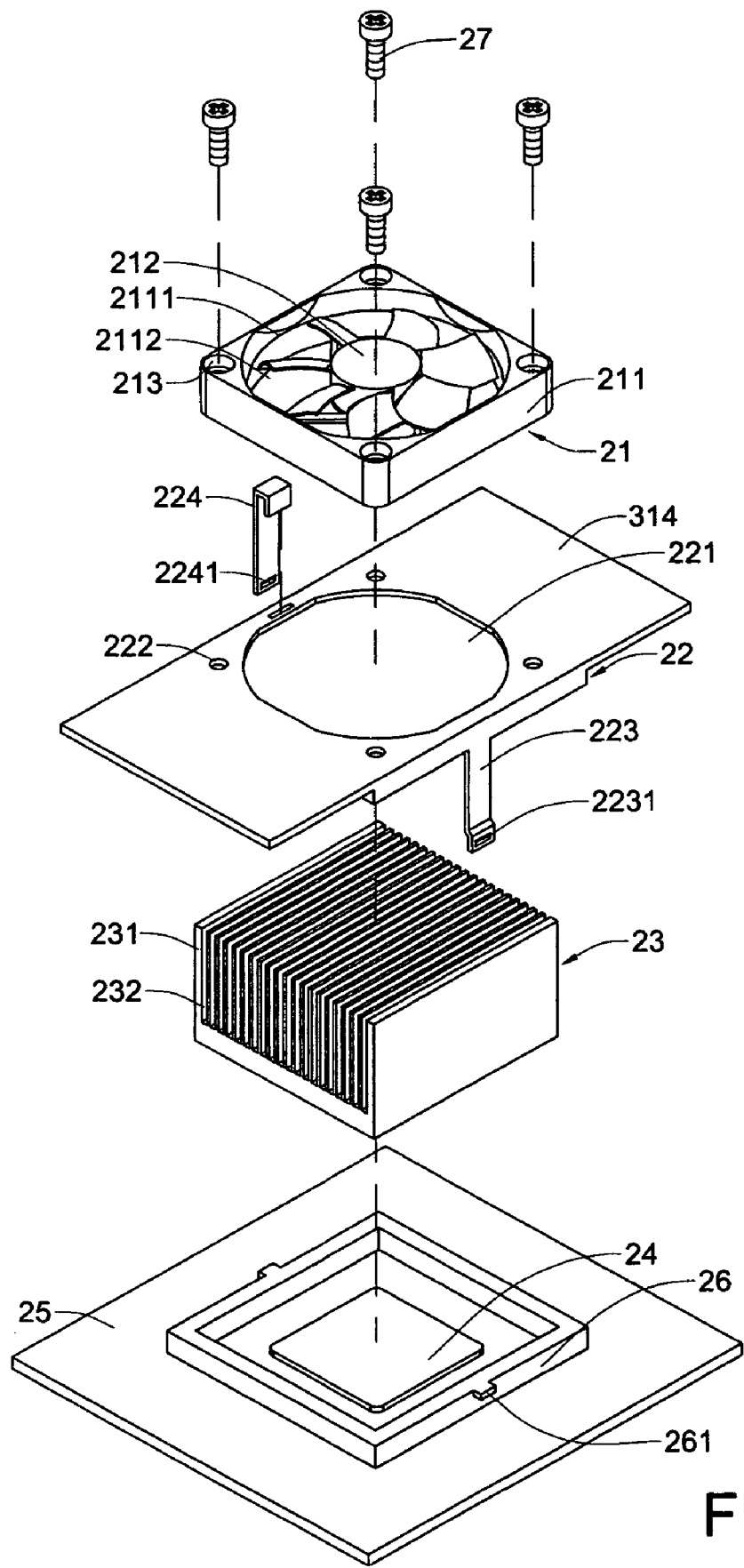
FIG. 7 is an exploded perspective view of the second embodiment of a radiation module capable of resisting reverse flow of hot fluid according to the present invention.
Figure 8:
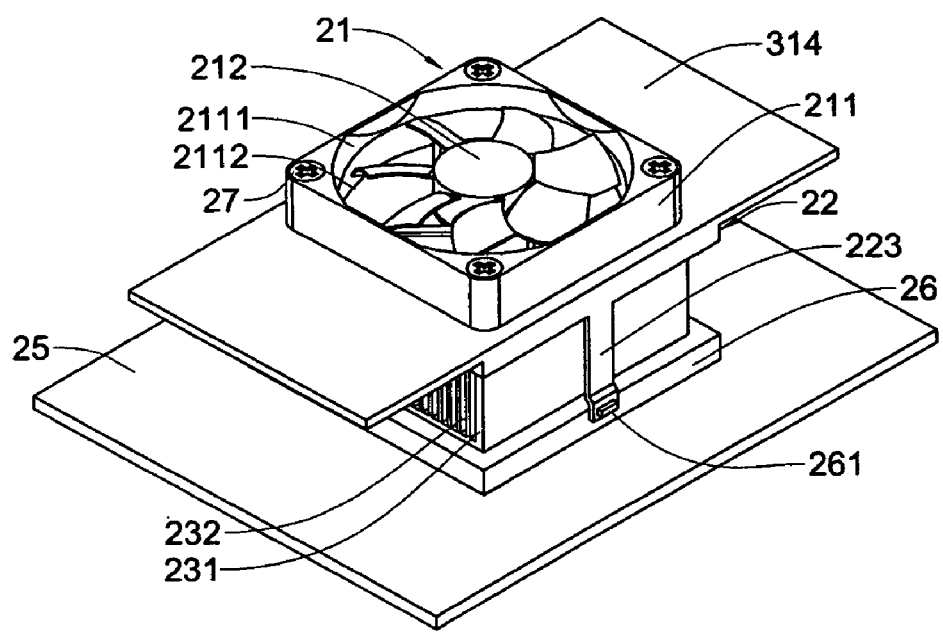
FIG. 8 is an assembled perspective view of the second embodiment according to the present invention.
Figure 9:
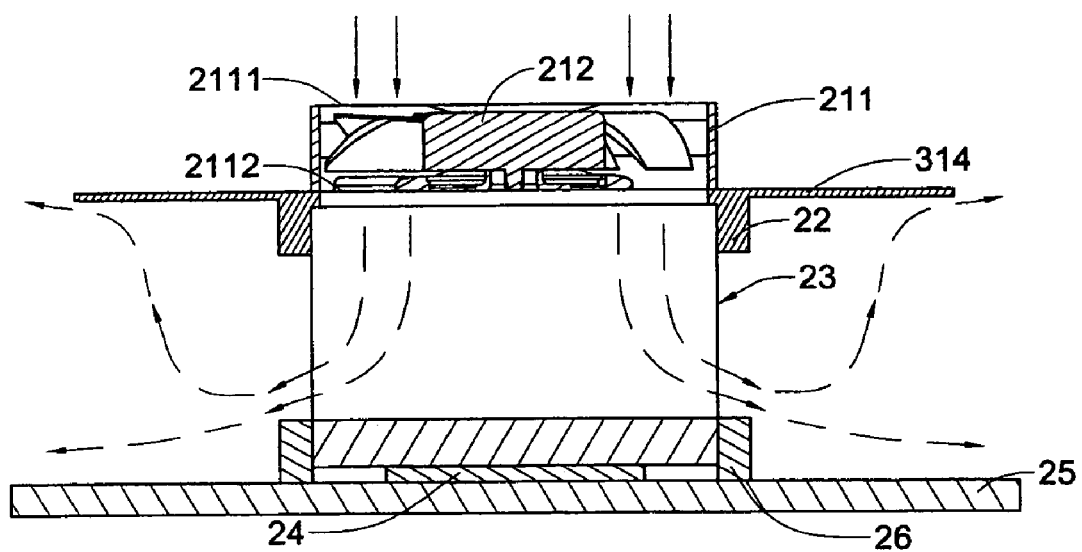
FIG. 9 is a sectional view of the second embodiment according to the present invention illustrating operation thereof.

Referring to FIGS. 7 to 9, the second embodiment of the present invention is illustrated. The entire structure and function of radiation module in the second embodiment is almost the same as first embodiment and it is noted the identical parts and reference numbers will not be described in detail. The difference of the second embodiment is in that the baffle part 314 extends from two opposite sides of the retaining tool 22 instead of extending from the fan frame 211 and the baffle part 214 can be made integrally with the retaining tool 22 or can be a separate unit from the retaining tool 22.

Figure 10:
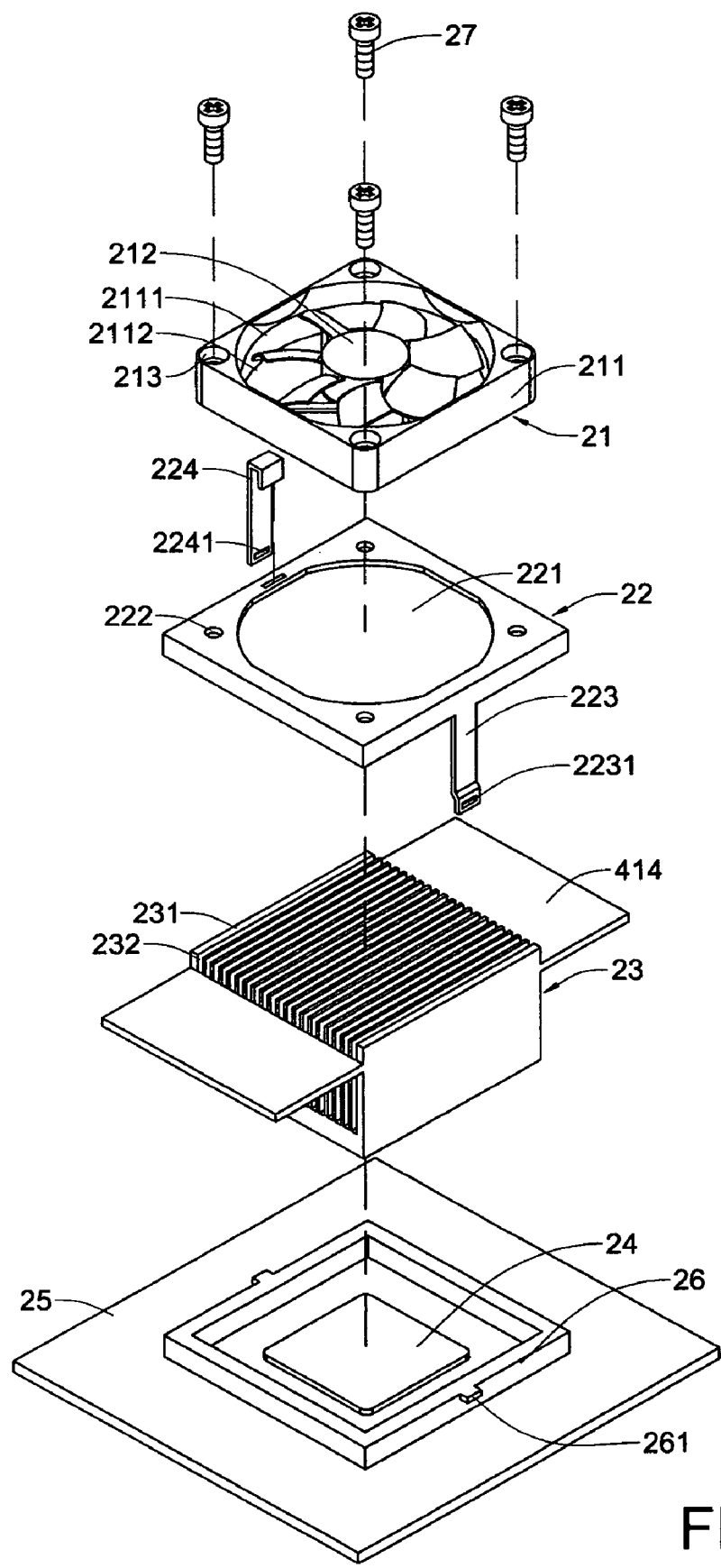
FIG. 10 is an exploded perspective view of the third embodiment of a radiation module capable of resisting reverse flow of hot fluid according to the present invention.
Figure 11:
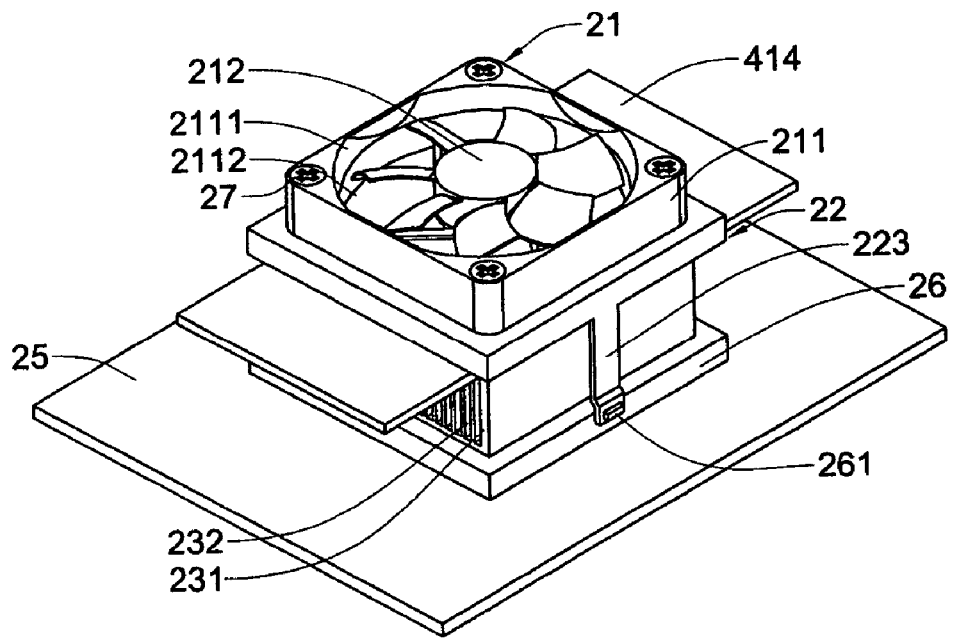
FIG. 11 is an assembled perspective view of the third embodiment according to the present invention.
Figure 12:
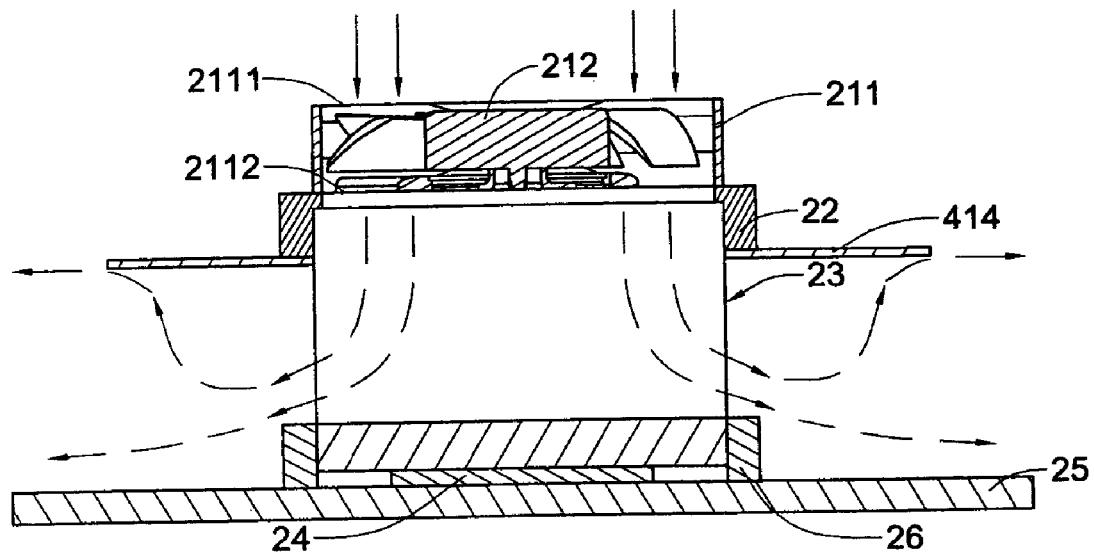
FIG. 12 is a sectional view of the third embodiment according to the present invention illustrating operation thereof.

Referring to FIGS. 10 to 12, the third embodiment of the present invention is illustrated. The entire structure and function of radiation module in the third embodiment is almost the same as the preceding embodiments and it is noted the identical parts and reference numbers will not be described in detail. The difference of the third embodiment is in that the baffle part 414 extends outward from two opposite upper lateral edges of the cooling fins 231 respectively in a way of being perpendicular and intersecting to both lateral ends of the respective flow passage 232. The baffle part 414 can be made integrally with the radiator 23 or can be a separate unit from the radiator 23.

Figure 13:
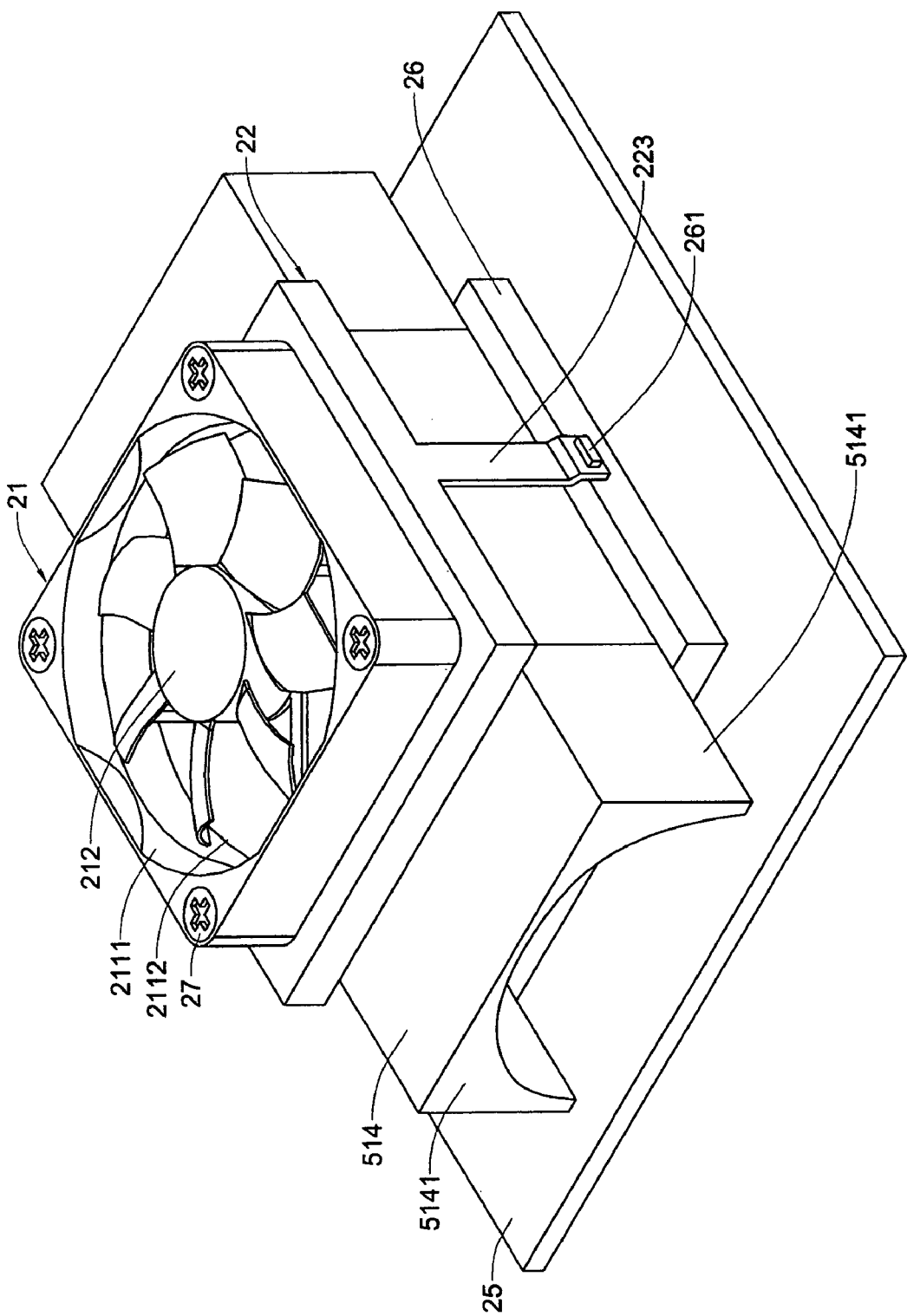
FIG. 13 is an assembled perspective view of the fourth embodiment of a radiation module capable of resisting reverse flow of hot fluid according to the present invention.

Referring to FIG. 13, the fourth embodiment of the present invention is illustrated. The entire structure and function of radiation module in the fourth embodiment is almost the same as the preceding embodiments and it is noted the identical parts and reference numbers will not be described in detail. The difference of the fourth embodiment from the third embodiment is in that the baffle part 514 provides a side wall 5141 at the two lateral sides thereof respectively and the side wall 5141 is parallel and adjacent with the cooling fins 231 of the radiator 23. The baffle part 414 can be made integrally with the radiator 23 or can be a separate unit from the radiator 23.

Figure 14:
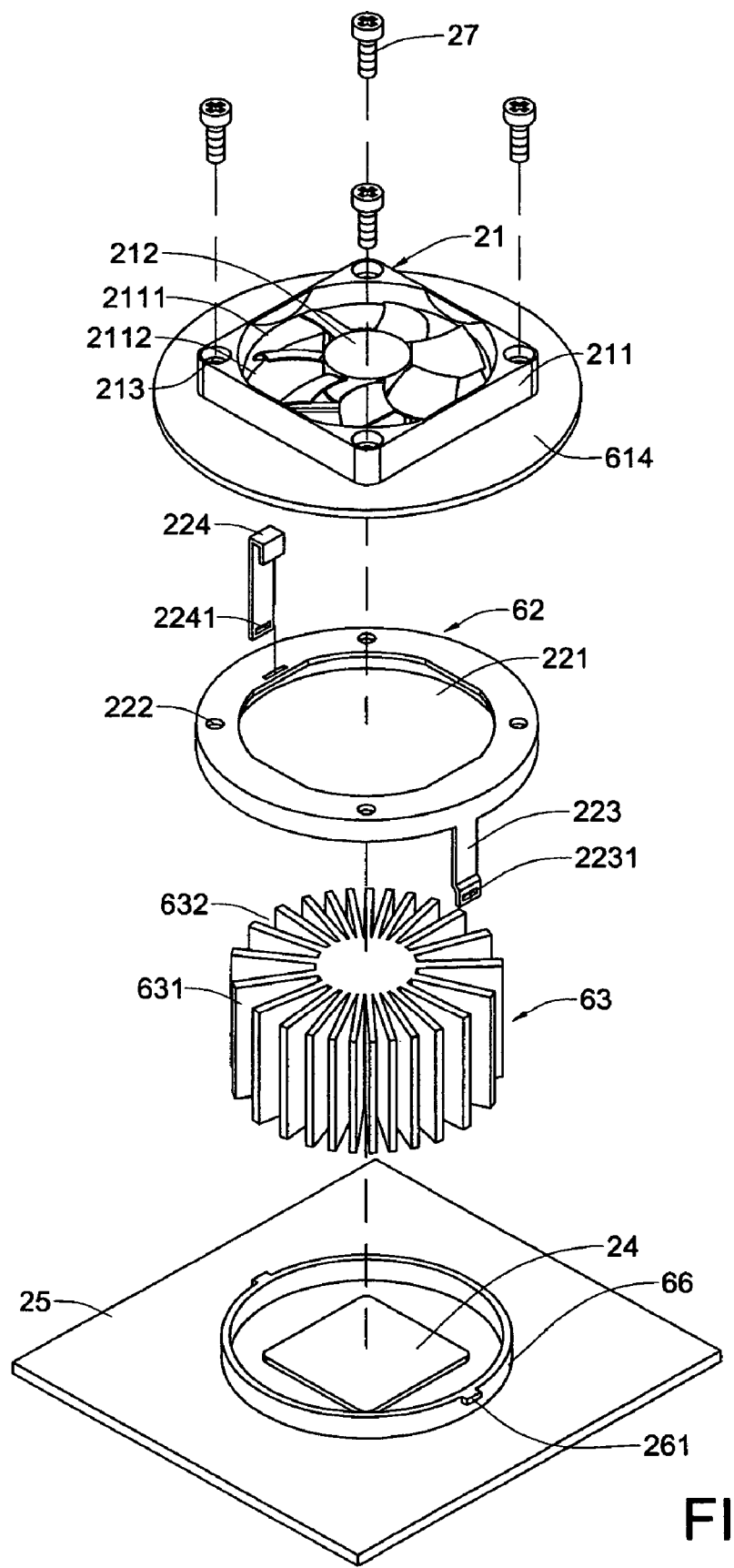
FIG. 14 is an exploded perspective view of the fifth embodiment of a radiation module capable of resisting reverse flow of hot fluid according to the present invention.
Figure 15:
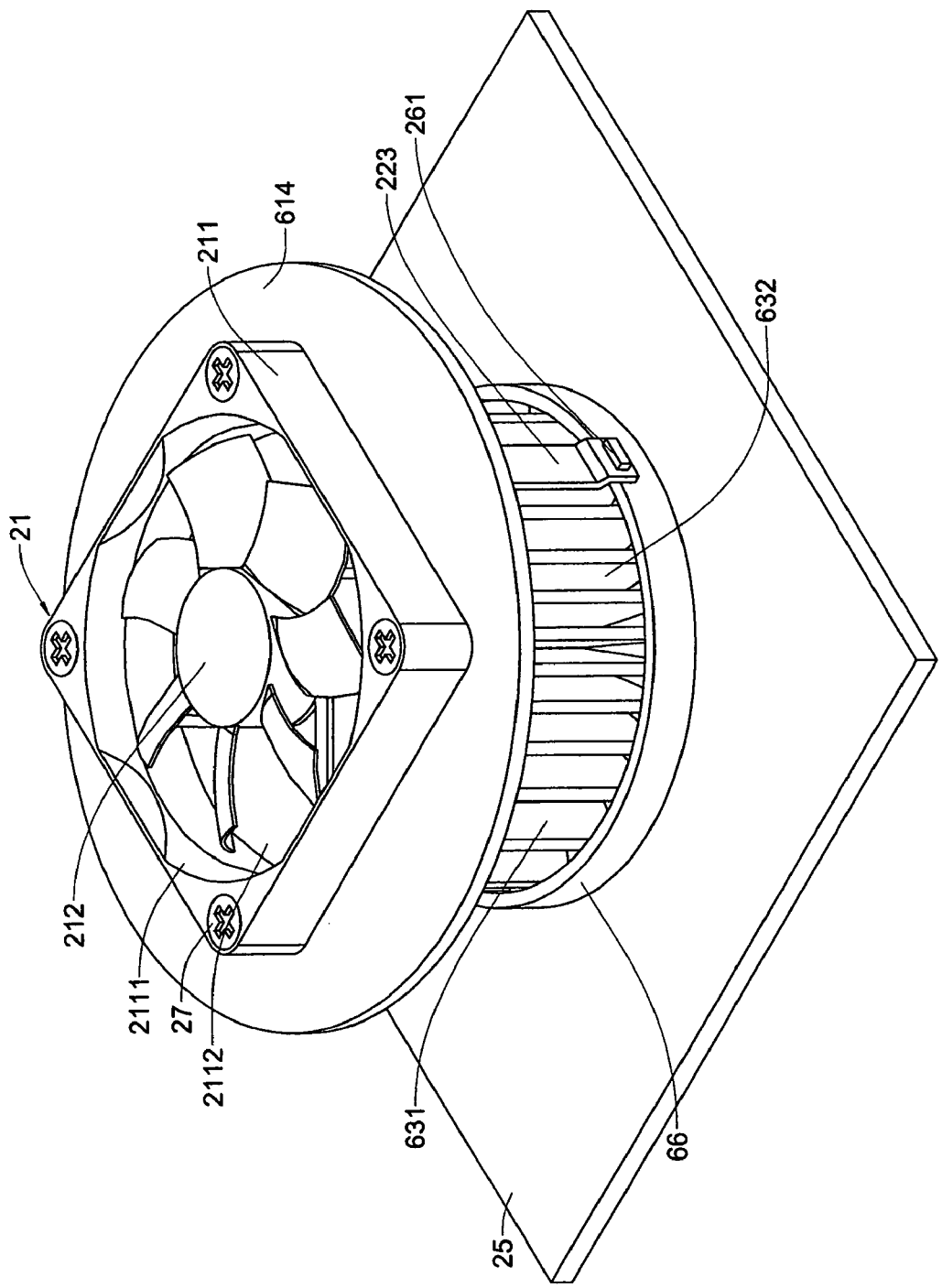
FIG. 15 is an assembled perspective view of the fifth embodiment of a radiation module capable of resisting reverse flow of hot fluid according to the present invention.

Referring to FIGS. 14 and 15, the fifth embodiment of the present invention is illustrated. The entire structure and function of radiation module in the third embodiment is almost the same as the preceding embodiments and it is noted the identical parts and reference numbers will not be described in detail. The difference of the fifth embodiment from the previous embodiments is in that the radiator 63 is cylindrical with the cooling fins 631 extending outward radially with radial shaped flow passages 632 between the cooling fins 631. The retaining tool 62 is annular to correspond to the cylindrical radiator 63 and the base seat 66 of the main board 25 is annular to correspond to the radiator 63 too. The baffle part 614 extends outward from the bottom of the fan frame 211 with a circular periphery shape and diameter of the baffle part 614 is greater than diameter of the cylindrical radiator 63 such that the hot fluid moving outward the flow passages 632 is resisted to flow back to the inlet 2111.

Referring to FIGS. 16 to 21, the baffle parts 214, 314, 414, 514, 614 in the preceding embodiments can be any shape such as being semicircular shown in FIG. 16, semi-ellipse shown in FIG. 17, trapezoidal as shown in FIG. 18, pentagon as shown in FIG. 19, hexagon as shown in FIG. 20, irregular shape as shown in FIG. 21. Besides, the baffle part 214, 314, 414, 514, 614 can be made of sound absorptive material to absorb noise resulting from running fan 21 and fluid flowing so as to reduce the sound decibel of the entire radiation module.

While the invention has been described with referencing to preferred embodiments thereof, it is to be understood that modifications or variations may be easily made without departing from the spirit of this invention, which is defined by the appended claims.

What is claimed is:

1. A radiation module capable of resisting reverse flow of hot fluid, comprising;
   a fan, providing a square fan frame with a circular inlet and a circular outlet and a first through hole being provided at four corners of the fan frame for being passed through with a fastener respectively;
   a square plate shaped retaining tool, being disposed next to the fan, providing a second through hole at four corners thereof corresponding to the first through hole for being passed through with the fastener, a first elongated holding part extending downward from the center of a lateral side thereof, a slot being disposed at another lateral side thereof corresponding to the first holding part available for a second elongated holding part passing through and both of the holding parts having an engaging hole at lower ends thereof;
   a square radiator, being disposed next to the retaining tool to be associated with the retaining tool and the fan with the fastener and being embraced by the holding parts, providing a plurality of parallel cooling fins and a plurality of flow passages being disposed between the cooling fins to space apart the cooling fins such that hot fluid is capable of moving outward via both lateral ends of the respective flow passages; and
   a base seat, being a square frame attached to a main board for receiving the bottom of the radiator, a locking piece jutting out the center of two opposite sides thereof for engaging with the engaging holes respectively; and
   a heat-generating component, being disposed on the main board and in the base seat to be kept contact with the bottom of the radiator;
   characterized in that a rectangular baffle part extends from periphery of the inlet across two opposite lateral sides of the fan fame and along another two lateral sides of the fan frame such that the baffle part is arranged at a position exceeding the lateral ends of the respective flow passage;
   whereby, fluid, which enters the fan via the inlet and flows toward the radiator via the outlet to perform heat transfer to heat in the radiator and moves outward from both lateral ends of the respective flow passage, is resisted to move back to the inlet by means of the baffle part.

2. The radiation module capable of resisting reverse flow of hot fluid as defined in claim 1, wherein the baffle part extends from another two opposite lateral sides of the retaining tool to a position exceeding the lateral ends of the respective flow passage instead of extending from the periphery of the inlet.

3. The radiation module capable of resisting reverse flow of hot fluid as defined in claim 1, wherein the baffle part extends outward from two opposite upper lateral edges of the cooling fins respectively to a position exceeding the lateral ends of the respective flow passage the baffle part in a way of being perpendicular and intersecting to both lateral ends of the respective flow passage instead of extending from the periphery of the inlet.

4. The radiation module capable of resisting reverse flow of hot fluid as defined in claim 3, wherein the baffle part provides a side wall at the two lateral sides thereof respectively and the side wall is adjacent to the outermost one of cooling fin of the radiator.

5. A radiation module capable of resisting reverse flow of hot fluid, comprising:
   a fan, providing a square fan frame with a circular inlet and a circular outlet and a first through hole being provided at four corners of the fan frame for being passed through with a fastener respectively;
   a ring shaped retaining tool, being disposed next to the fan, providing four second through holes corresponding to the first through hole for being passed through with the fastener, a first elongated holding part extending downward from periphery thereof, a slot being disposed at the periphery opposite to the first holding part available for a second elongated holding part passing through and both of the holding parts having an engaging hole at lower ends thereof;
   a cylindrical radiator, being disposed next to the retaining tool to be associated with the retaining tool and the fan with the fastener and being embraced by the holding parts, providing a plurality of radial cooling fins and a plurality of radial flow passages being disposed between the cooling fins to space apart the cooling fins such that hot fluid is capable of moving outward via the flow passages; and
   a base seat, being a circular frame attached to a main board for receiving the bottom of the cylindrical radiator, two locking pieces jutting out to correspond to the holding parts for engaging with the engaging holes respectively; and
   a heat-generating component, being disposed on the main board and in the base seat to be kept contact with the bottom of the radiator;
   characterized in that a circular baffle part extends from the bottom of the fan frame with a diameter being much greater than that of the radiator;
   whereby, fluid, which enters the fan via the inlet and flows toward the radiator via the outlet to perform heat transfer to heat in the radiator and moves outward via the flow passages, is resisted moving back to the inlet by means of the baffle part.

* * * * *